United States Patent
Rambault

(10) Patent No.: US 11,029,350 B2
(45) Date of Patent: Jun. 8, 2021

(54) DETERMINATION OF HARMONIC POLLUTION ON AN ELECTRICAL DISTRIBUTION NETWORK

(71) Applicant: UNIVERSITÉ DE POITIERS, Poitiers (FR)

(72) Inventor: Laurent Rambault, Buxerolles (FR)

(73) Assignee: UNIVERSITÉ DE POITIERS, Poitiers (FR)

( * ) Notice: Subject to any disclaimer, the term of this patent is extended or adjusted under 35 U.S.C. 154(b) by 488 days.

(21) Appl. No.: 15/766,635

(22) PCT Filed: Oct. 4, 2016

(86) PCT No.: PCT/FR2016/052540
§ 371 (c)(1),
(2) Date: Apr. 6, 2018

(87) PCT Pub. No.: WO2017/060606
PCT Pub. Date: Apr. 13, 2017

(65) Prior Publication Data
US 2018/0313879 A1    Nov. 1, 2018

(30) Foreign Application Priority Data
Oct. 6, 2015 (FR) ...................................... 1559507

(51) Int. Cl.
*G01R 27/26* (2006.01)
*H02J 3/01* (2006.01)
(Continued)

(52) U.S. Cl.
CPC ......... *G01R 27/2688* (2013.01); *G01R 27/16* (2013.01); *H02J 3/01* (2013.01);
(Continued)

(58) Field of Classification Search
CPC ............... G01R 27/2688; G01R 27/02; G01R 19/2513; G01R 27/16; Y02E 40/40; H02J 13/00; H02J 13/0006
See application file for complete search history.

(56) References Cited

U.S. PATENT DOCUMENTS 6,147,475 A * 11/2000 Bridgeman ......... H02J 3/00125
323/211
8,120,347 B1 * 2/2012 Cao ..................... H02M 1/4225
323/285
(Continued)

FOREIGN PATENT DOCUMENTS

JP          3037477 B2     4/2000
WO       WO-0010017 A1 *  2/2000 ............. G01R 23/20
(Continued)

OTHER PUBLICATIONS

Nos, "Control Strategy of Shunt Active Power Filter Based on an Algebraic Approach," 16th International Conference on Micro/Nanotechnologies and Electron Devices EDM 2015, pp. 459-463. (Year: 2015).*

(Continued)

*Primary Examiner* — Catherine T. Rastovski
*Assistant Examiner* — Liam R Casey
(74) *Attorney, Agent, or Firm* — Kenealy Vaidya LLP

(57) ABSTRACT

Some embodiments are directed to a method for detecting harmonic pollution in an electrical distribution network carrying a three-phase current, including a step of measuring the voltages and strengths of the current, for each of said phases, at a counting point of the network; a step of calculating a first quaternion impedance corresponding to the fundamental frequency of the current; a step of calculating at least one second quaternion impedance corresponding to a harmonic frequency of the current, these impedances being calculated by converting the voltages and strengths in (Continued)

a two-dimensional frame of reference defined according to an angle that is dependent on said frequency in order to provide a system of two vectors of three quantities, ud, uq, uo and id, iq, io, respectively.

21 Claims, 1 Drawing Sheet

(51) Int. Cl.
  G01R 27/16 (2006.01)
  H02J 13/00 (2006.01)
(52) U.S. Cl.
  CPC ......... H02J 13/0006 (2013.01); *H02J 13/00* (2013.01); *Y02E 40/40* (2013.01)

(56) References Cited

U.S. PATENT DOCUMENTS

| | | | | |
|---|---|---|---|---|
| 9,712,040 | B1* | 7/2017 | Kim | H02M 7/44 |
| 2005/0275976 | A1* | 12/2005 | Taimela | H02M 1/4208 |
| | | | | 361/18 |
| 2010/0324844 | A1* | 12/2010 | Marti | G01R 21/133 |
| | | | | 702/61 |
| 2011/0082486 | A1* | 4/2011 | Messerly | A61B 18/14 |
| | | | | 606/169 |
| 2011/0245990 | A1* | 10/2011 | Rasmussen | H02J 3/46 |
| | | | | 700/298 |
| 2014/0049117 | A1* | 2/2014 | Rahman | H02J 13/0006 |
| | | | | 307/82 |
| 2014/0362617 | A1* | 12/2014 | Li | G06N 3/084 |
| | | | | 363/34 |
| 2015/0137779 | A1* | 5/2015 | Takase | H02M 5/297 |
| | | | | 323/273 |
| 2016/0187400 | A1* | 6/2016 | Ji | G01R 22/063 |
| | | | | 324/107 |

FOREIGN PATENT DOCUMENTS

| | | |
|---|---|---|
| WO | WO2012/000510 A1 | 1/2012 |
| WO | WO2013/057416 A1 | 4/2013 |

OTHER PUBLICATIONS

Barry, "Electrical circuit analysis using fourdimensional complex numbers, in the form of quaternions," 2013 48th International Universities' Power Engineering Conference (UPEC) (Year: 2013).*
Fei, Q., et al., "Research on the responsibility partition of harmonic pollution and harmonic impedance based on the total least-squares regression method," 2014 International Conference on Power System Technology, IEEE, Oct. 20, 2014, pp. 2122-2127, XP032712132.
International Search Report for PCT Patent App. No. PCT/FR2016/052540 (dated Jan. 26, 2017) with English translation thereof.
Written Opinion for PCT Patent App. No. PCT/FR2016/052540 (dated Jan. 26, 2017).

* cited by examiner

DETERMINATION OF HARMONIC POLLUTION ON AN ELECTRICAL DISTRIBUTION NETWORK

CROSS REFERENCE TO RELATED APPLICATIONS

This application is a national phase filing under 35 C.F.R. § 371 of and claims priority to PCT Patent Application No. PCT/FR2016/052540, filed on Oct. 4, 2016, which claims the priority benefit under 35 U.S.C. § 119 of French Patent Application No. 1559507, filed on Oct. 6, 2015, the contents of each of which are hereby incorporated in their entireties by reference.

BACKGROUND

Some embodiments are directed to detecting harmonic pollution within an electricity distribution network. Some embodiments make it possible not only to detect harmonic pollution, but to measure it and, depending on the method of operation, determine the location of the harmonic pollution.

In theory, an electricity distribution network (or more simply "electricity network") carries electricity in the form of a fixed-frequency sinusoid (50 Hz in France) power plants to consumers. These consumers can be individuals, with a limited amount of equipment, also of limited size, or industrial establishments that may have an enormous amount of equipment and very high electricity consumption needs.

Certain kinds of equipment can disturb this signal and create harmonic distortion. Generally, this equipment is installed at the consumer's site and the distribution network manager cannot control it.

This harmonic distortion is caused by non-linear loads connected to the electricity network, which induces the harmonic components of the signal. These non-linear loads can be due to poorly maintained, defective, or poorly designed equipment. Certain types of equipment also inherently have non-linear loads like, for example, LEDs (Light Emitting Diode), domestic appliance power supply, and speed drives for electric motors, among others. Today it is believed that the energy corresponding to these harmonic disturbances corresponds to about 5% of total energy use. Due to the increase in the number of equipment with inherent non-linear loads, this number will grow significantly in the future.

SUMMARY

A major disadvantage of harmonic disturbances is that it propagates across the whole electricity distribution network, and does not stay limited to the consumer's private network.

However, some equipment can be very sensitive to this phenomenon, which could disturb or even damage it. This is the case for equipment like televisions, etc., that can have their life span considerably reduced due to the harmonic disturbances on the electricity network.

Furthermore, the electricity consumption measurement mechanisms carried out by the distribution network managers via meters are based on basic measurements. In other words, only the energy corresponding to 50 Hz (for France) is taken into account to determine a consumer's consumption. The energy corresponding to the harmonic frequencies is not taken into account, and thus cannot be billed to the consumer, which corresponds to a 5% loss.

Controlling harmonic disturbances as best as possible is thus a crucial challenge for electricity distribution network managers.

Nevertheless, these solutions do not allow for determination of the source of harmonic pollution. Filters have to be placed at each consumer connection to ensure that local disturbances do not propagate.

This obviously expensive solution is not perfect: for a filter to be effective, the kind of harmonic pollution and its estimation must or should be known.

Current solutions, particularly filtering solutions, are based on a model of the electricity network being located physically at the consumer's site. Using this model, it is possible to figure out how to remove or substantially reduce the energies corresponding to the harmonic frequencies at the filter.

It is, however, very difficult to create a model of a consumer network due to the differences among consumers, but also, and especially, the dynamic nature of the loads connected to an electricity network. Depending on the time of day, and even from one minute to another, the connected load can vary greatly.

Thus, a solution based on modeling consumer electricity networks must or should be highly insufficient.

An example of such a model-based solution is described in the article "Research on the Responsibility Partition of Harmonic Pollution and Harmonic Impedance Based on the Total Least-squares 25 Regression Method" by Qi Fei, Li Jian-Wen, Li Yong-gang, Sun Wei and Li Zhong-Jian. This approach suffers from the above-mentioned disadvantages, namely the failure to account for the dynamic nature of consumer electricity networks.

Moreover, this solution does not make it possible to locate the source of pollution. Indeed, one can use it to determine if a consumer network suffers from harmonic pollution, but it does not allow for determination if the harmonic pollution is due to the consumer network, or if it comes from another consumer through the distribution network.

Failing to locate the source of harmonic pollution, it does not allow for the implementation of fully effective countermeasures.

Some embodiments are directed to a method and a system that at least partially counteract the above-mentioned disadvantages.

One embodiment is directed to a procedure to detect harmonic pollution within an electricity distribution network transmitting a current, including measuring at least one voltage and at least one magnitude of the current, for each of the phases, at a metering point of the network, calculating a first quaternion-based impendence corresponding to the fundamental frequency of the current, and calculating at least a second quaternion-based impendence corresponding to a harmonic frequency of the current.

The impendences, Zr, Zi, are calculated by transforming the voltages and magnitudes in a two-dimensional transform, defined according to an angle based on the frequency in order to provide a 2-vector system of 3 quantities, ud, uq, uo and id, iq, io, respectively, then, after using a notation in quaternions, applying the expression:

For the real part:

$$Z_r = \frac{u_d \times i_d + u_q \times i_q}{i_d \times i_d + i_q \times i_q}$$

For the imaginary part:

$$Zi = \frac{u_q \times i_d + u_d \times i_q}{i_d \times i_d + i_q \times i_q}$$

Some embodiments also include:
determining the harmonic pollution based on the difference between the first impedance and the at least one second impedance.

Based on an advantageous or preferred method of operation, some embodiments include one or several of the following characteristics, which can be used separately or in partial or total combination with one another:
The current is three-phased, the measurement step includes measuring the voltages and magnitudes of the three phases, and the two-dimensional transform includes the two first dimensions of a Park transform.
The current is monophasic and the two-dimensional transform is defined by the equations:

$$\begin{cases} u_d = V \times \sin(\theta) \\ u_q = V \times \cos(\theta) \end{cases}$$
$$\begin{cases} i_d = I \times \sin(\theta) \\ i_q = I \times \cos(\theta) \end{cases}$$

The harmonic frequency is of order 5, and
The at least one second impendence corresponds to the harmonic frequency among the orders 5, 7, 11, 13, 17, 19, and 23, Another embodiment is directed to a meter adapted to be able to detect harmonic pollution within an electricity distribution network transmitting a current, including:
A device for measuring the voltages and magnitudes of the current, for each of the phases, at a metering point of the network,
A device for calculating a first quaternion-based impedance corresponding to the fundamental frequency of the current, and
A device for calculating at least a second quaternion-based impedance corresponding to a harmonic frequency of the current.

The impedances are calculated by transforming the voltages and magnitudes in a two-dimensional transform defined according to an angle depending on the frequency in order to provide a 2-vector system of 3 quantities (ud, uq, uo and id, iq, io, respectively) then, after using a notation in quaternions, by applying the expressions:
For the real part:

$$Z_r = \frac{u_d \times i_d + u_q \times i_q}{i_d \times i_d + i_q \times i_q}$$

For the imaginary part:

$$Zi = \frac{u_q \times i_d + u_d \times i_q}{i_d \times i_d + i_q \times i_q}$$

Some embodiments also include:
A device for determining a harmonic pollution based on the difference between the first impedance and the at least one second impedance.

Based on an advantageous or preferred method of operation, some embodiments include one or several of the following characteristics, which can be used separately or in partial or total combination with one another:
The current is three-phased, the measurement step includes measuring the voltages and magnitudes of the three phases, and the two-dimensional transform includes the two first dimensions of a Park transform,
The current is monophasic and the two-dimensional transform is defined by the equations:

$$\begin{cases} u_d = V \times \sin(\theta) \\ u_q = V \times \cos(\theta) \end{cases}$$
$$\begin{cases} i_d = I \times \sin(\theta) \\ i_q = I \times \cos(\theta) \end{cases}$$

The harmonic frequency is of order 5, and
The at least one second impendence corresponds to the harmonic frequency among the orders 5, 7, 11, 13, 17, 19, and 23.

Another embodiment is directed to an electricity distribution network including at least one meter as defined above.

According to one method of operation, this distribution network can include a plurality of distribution branches between a terminal and consumers, and a meter associated to each of the consumers, in order to determine the consumer(s) at the source of a harmonic pollution.

Another embodiment involves a system including a meter as defined above and an anti-harmonic filter, in which the harmonic pollution, defined by the meter, allows the filter to be dynamically configured.

Thus, the above embodiments are able to not only determine if a harmonic pollution exists, but also allow us to quantify it.

Other characteristics and advantages of some embodiments will be described below, which follows the advantageous or preferred mode of operating some embodiments, given as an example and in reference to the drawings attached.

DETAILED DESCRIPTION OF EXEMPLARY EMBODIMENTS

Figure 1:
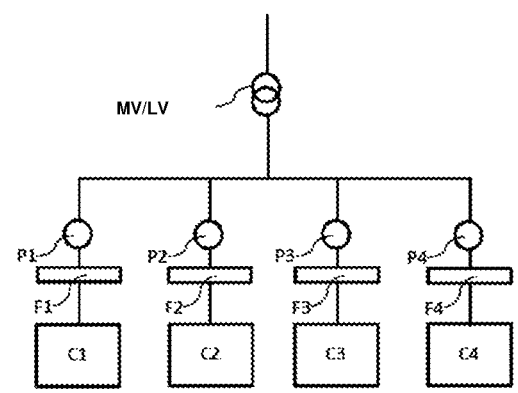
FIG. 1 schematically represents an example of the electricity distribution network with a use according to one mode of operation in accordance with some embodiments.

FIG. 1 maps a distribution network that powers 4 consumers, or clients, C1, C2, C3, C4 in low, three-phase voltages.

An input to this terminal segment of a distribution network can be an MV/LV transformer that can lower a medium voltage (e.g. 20 kV) to a low voltage (e.g. 400 V). Meter points P1, P2, P3, P4 are associated to each consumer C1, C2, C3, C4, respectively. They can be located at the input of the consumers' private electricity network in order to count the electricity consumption of the associated client.

According to one method of operation in accordance with some embodiments, these metering points, or meters, are adapted to determine a quantity of harmonic pollution on the electricity network generated by consumers.

Some embodiments also enable a harmonic pollution to be located. Since a harmonic pollution propagates on the distribution network, it should be noted that certain methods involving the measurement of the harmonic pollution at a consumer's site can measure pollution coming from another consumer. As such, these methods do not provide effective corrective action.

In other words, it is critical not only to be able to measure a harmonic pollution but actually to locate it, meaning to determine the consumption network from which it originates.

An additional metering point P5, located near the MV/LV transformer can also be adapted to determine a quantity of harmonic pollution. According to some embodiments, the quantity determined by this additional metering point is the sum of the quantities determined by the metering points P1, P2, P3, P4.

Thus, some embodiments also make it possible to determine which consumers cause the largest harmonic pollution. Pollution measures provided by the metering points P1, P2, P3, P4 make it possible, for example, to configure the filters F1, F2, F3, F4, respectively. Thus, the anti-harmonic filters can be dynamically configured by measurements representing the non-linear load connected to the consumers' networks.

As such, harmonic pollution can be significantly reduced, even totally removed from the distribution network. Harmonic pollution generated on the private network of a consumer remains restricted to this private network and does not disturb the other consumers. Furthermore, there is no accumulation effect, since each consumer's harmonic disturbances no longer overlap one another.

In addition, the distribution network manager can have a specific measurement of each consumer's pollution. This measurement makes it possible for the network manager to take individualized corrective action if, for example, the pollution exceeds a given threshold. Indeed, a level of harmonic pollution can be deemed acceptable, particularly if it can be easily removed by an anti-harmonic filter, but certain high levels of harmonic pollution can require a specific intervention.

Finally, knowing a quantified level of harmonic pollution can help reduce consumers' actual electricity consumption. Indeed, it is therefore possible to know the consumed energy corresponding to each harmonic frequency, or even the main harmonic frequencies and therefore the total energy.

According to some embodiments, the determination of the harmonic distortion of order 5 can be enough to provide a good estimation of the overall harmonic pollution. Alternatively, it can be possible to take into account the harmonics of order 5 and 7, or 5, 7, 11, or any number of harmonics among the orders 5, 7, 11, 13, 17, 19, 23, etc. in order to be able to provide the most specific estimation of the overall harmonic pollution.

Initially, voltage and magnitude are measured on a metering point.

This measurement is carried out for the three phases, thus providing two vectors for three components:

V=[V1, V2, V3], for voltage, and,

I=[I1, I2, I3], for the magnitude of the current.

Then, according to some embodiments, we calculate a first impedance corresponding to the basic frequency of the current.

Generally, the procedure according to some embodiments includes, for this purpose, the transformation of the voltages and magnitudes measured in a two-dimensional transform, defined according to an angle that depends on a given frequency.

According to one first mode of operation described, the electrical current is a three-phase electrical current.

In this case, the impedance is calculated by transforming the voltages V and the magnitudes I in a Park transform, or a Park-type transformation, according to an angular speed that is based on this basic frequency.

This Park transform makes it possible to transform a 3D vector into a 2D mathematical space. Other transforms possess similar properties to the Park transform like, for example, the DQO (Direct Quadrature Zero) transform.

Thus, the current's magnitude vector I=[I1, I2, I3] can provide a magnitude $I_{dqo}$ according to the Park transform, according to the following equation:

$$i_{dqo} = P \cdot I = \frac{2}{3} \cdot \begin{bmatrix} \cos(\theta) & \cos\left(\theta - \frac{2\pi}{3}\right) & \cos\left(\theta + \frac{2\pi}{3}\right) \\ -\sin(\theta) & -\sin\left(\theta - \frac{2\pi}{3}\right) & -\sin\left(\theta + \frac{2\pi}{3}\right) \\ \frac{1}{2} & \frac{1}{2} & \frac{1}{2} \end{bmatrix} \cdot \begin{bmatrix} I1 \\ I2 \\ I3 \end{bmatrix}$$

The current's magnitude vector I=[I1, I2, I3] can provide a magnitude $I_{dqo}$ according to the DQO transformation, according to the following equation:

$$i_{dqo} = P \cdot I = \sqrt{\frac{2}{3}} \cdot \begin{bmatrix} \cos(\theta) & \cos\left(\theta - \frac{2\pi}{3}\right) & \cos\left(\theta + \frac{2\pi}{3}\right) \\ -\sin(\theta) & -\sin\left(\theta - \frac{2\pi}{3}\right) & -\sin\left(\theta + \frac{2\pi}{3}\right) \\ \frac{\sqrt{2}}{2} & \frac{\sqrt{2}}{2} & \frac{\sqrt{2}}{2} \end{bmatrix} \cdot \begin{bmatrix} I1 \\ I2 \\ I3 \end{bmatrix}$$

Similar equations can be written for the voltages V=[V1, V2, V3].

These two transformations differ only by the $3^{rd}$ line of the transformation matrix P. However, in the context of some embodiments and as it will be seen below, this $3^{rd}$ line is not used in the calculations and is shown here only for the purpose of having an inverse matrix. As a result, some embodiments can use different transforms that will be below referred to as the "Park transform" or the "Park-type transform."

The angle θ corresponds to the given frequency, according to a classic relationship: θ=2πtf, in which t is time and f is the given frequency.

According to some embodiments, there are at least two frequencies to consider: the basic frequency and a harmonic frequency, for example the harmonic frequency of order 5. Also, for this purpose, the calculations presented must or should be done for at least two values of the angle θ.

According to a second implementation, the current and voltage are monophasic. This again may require returning to a two-dimensional transform, defined by angle θ (and also to allow comparisons as will be seen below).

The transformation that makes it possible to return to such a transform can be described by the expressions:

$$\begin{cases} u_d = V \times \sin(\theta) \\ u_q = V \times \cos(\theta) \end{cases}$$

$$\begin{cases} i_d = I \times \sin(\theta) \\ i_q = I \times \cos(\theta) \end{cases}$$

in which V and I respectively represent the monophasic voltage and magnitude. The angle θ can be determined, like for a three-phase current, by the equivalence: θ=2πtf, in which t is time and f is the given frequency.

In both of the implementations described, the sizes determined, ud, uq, id, and iq depend on time.

After determining these 4 sizes, we can determine the impedances by using quaternion notation. The impedances obtained will therefore also be quaternion-based.

According to a quaternion notation, it is possible to write both transformed vectors in the form $$V = v \cdot \cos(\psi 1) \cdot K + v \cdot \sin(\psi 1) \cdot L$$

$$I = i \cdot \cos(\psi 2) \cdot K + i \cdot \sin(\psi 2) \cdot L$$

in which K and L represent both perpendicular axes of the plane.

The apparent power S, which is defined by S=V·I*, or I*, represents the combined quantity of the magnitude I., can thus be expressed as:

$$S = (v \cdot \cos(\psi 1) \cdot K + v \cdot \sin(\psi 1) \cdot L) \cdot (-i \cdot \cos(\psi 2) \cdot K - i \cdot \sin(\psi 2) \cdot L)$$

Soit:

$$S = vi \cdot \cos(\psi 1 - \psi 2) + vi \cdot \sin(\psi 1 - \psi 2) \cdot M$$

In which M is a perpendicular axis in the plane formed by axes K and L.

This expression makes two terms P and Q appear, defined by:

P=vi·cos(ψ1−ψ2), representing the scalar part of the apparent power, meaning the active power.

Q=vi·sin(ψ1−ψ2)·M, representing the vectoral part of the apparent power, meaning the reactive power.

An impedance Z is defined by Z=V/I

Hence, S=V·I*=Z·I·I* and S=P+Q

We can therefore write the following equation:

$$Z = \frac{P}{I^2} + \frac{Q}{I^2}$$

According to some embodiments, this impedance Z is calculated for at least two frequencies, the basic one and at least one harmonic one.

Figure 2:
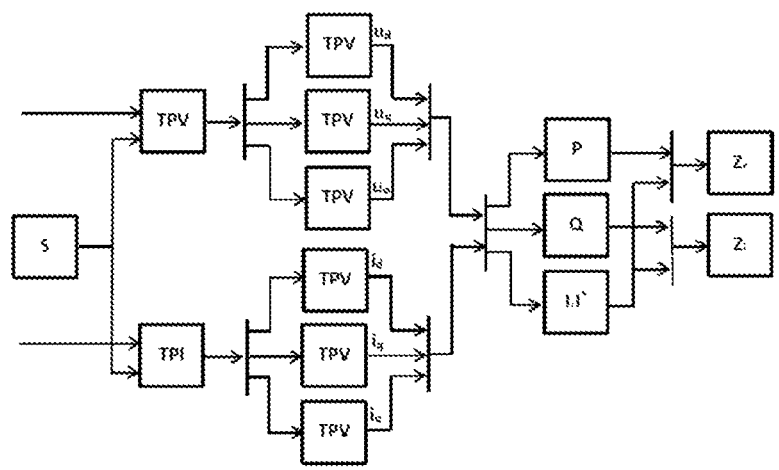
FIG. 2 schematically represents a functional view of the procedure of a mode of operation in accordance with some embodiments.

FIG. 2 illustrates the procedure schematically and non-exhaustively. It is a functional view of the procedure, which can be implemented following different technical methods.

The TPV and TPI blocks respectively represent Park transformations for the voltage V and the magnitude I of a current measured in a given metering point.

The block S represents a sinusoidal signal generator at the given frequency. According to some embodiments, the steps represented by FIG. 2 are initially carried out for the basic frequency, then at least once more at a harmonic frequency. For example, it can first be done at a frequency $f_0$=50 Hz, corresponding to the basic frequency in France, and a second time at a frequency of $f_5$=250 Hz, corresponding to the harmonic order 5 in France.

This sinusoid is provided in the input of the two TPV and TPI blocks in order to determine the angle θ of the Park transform matrices.

$$\theta_0 = 2\pi f_0$$

$$\theta_5 = 2\alpha f_5$$

The outputs of the TPV and TPI blocks are respectively of a voltage $u_{dpo}$ and a magnitude $i_{dpo}$ in the Park transform. This voltage and magnitude can then be transmitted to filters $F_{ud}$, $F_{ug}$, $F_{uo}$, $F_{id}$, $F_{iq}$, and $F_{io}$. These are low-pass filters, allowing for the ongoing isolation of the component in the Park transform, meaning the component at the given frequency. The components of the voltage $u_{dpo}$ can be demultiplexed in order to be processed by the specific filters $F_{ud}$, $F_{ug}$, and $F_{uo}$ for each component, respectively $u_d$, $u_q$, and $u_o$. Likewise, the components of the magnitude $u_{dpo}$ can be demultiplexed in order to be processed by the specific filters $F_{id}$, $F_{iq}$, and $F_{io}$ for each component, respectively $i_d$, $i_q$, and $i_o$.

These components $u_d$, $u_q$, $i_d$, $i_q$ and $i_o$ are then provided in the inputs of the calculation blocks P, Q, and I·I*. These blocks correspond to the calculations of quantities P, Q, and I·I* (=I²) previously defined and that correspond to the equation $$Z = \frac{P}{I^2} + \frac{Q}{I^2}.$$

Thus, the quantity P, which corresponds to the scalar part of the apparent power, meaning the active power, can be calculated from the components provided by the expression:

$$P = u_d \times i_d + u_q \times i_q$$

The quantity Q, which represents the vectoral part of the apparent power S, meaning the reactive power, can be calculated from the components provided by the expression:

$$Q = u_q \times i_d + u_d \times i_q$$

Finally, the quantity I·I* can be calculated from the components provided by the expression:

$$I \cdot I^* = i_d \times i_d + i_q \times i_q$$

The 3 results of these three calculation blocks provide the input for calculation blocks $Z_r$ and $Z_i$ of the next phase. As we saw above, impedance is provided by:

$$Z = \frac{P}{I^2} + \frac{Q}{I^2}$$

We can therefore determine a real impedance $Z_r$, and an imaginary impedance $Z_i$, according to:

$$Z_r = \frac{P}{I^2} \text{ and } Z_i = \frac{Q}{I^2}$$

These real and imaginary impedances can also be expressed as:

$$Z_r = \frac{u_d \times i_d + u_q \times i_q}{i_d \times i_d + i_q \times i_q}$$

$$Z_i = \frac{u_d \times i_d + u_q \times i_q}{i_d \times i_d + i_q \times i_q}$$

As we saw above, the real and imaginary impedances are quaternion-based. The imaginary part of the impedance represents the vectoral part following an axis perpendicular to the plane (d,q).

Thus, some embodiments include a first step of calculating the values of a first impedance $Z_r$, $Z_i$ for the frequency $f_0$ of the current's basic frequency at the metering point. The second step is to calculate at least a second impedance $Z_r$, $Z_i$ for the frequency of a harmonic order I at the same metering point. The third step is to determine the harmonic pollution based on the different between the first impedance (for the basic frequency) and a second impedance (for the harmonic frequency of order i).

Indeed, if there is a difference in the impedance between the measurements at different frequencies of the current, this means that the load is not behaving linearly and that this load is causing harmonic pollution.

A comparison with the load's impedance at harmonic order i=5 can be enough to have a good estimation of the behavior of the load's network, but it may be decided to consider other harmonic frequencies to improve the estimation.

Furthermore, the value of the difference in impedance $Z_r$, $Z_i$, can provide an indication of a degree of harmonic pollution. This degree can be compared to a threshold in order to provide an indication of harmonic pollution. This characteristic makes it possible to distinguish minor pollutions, on which a distribution manager might not want to take action, and more sizable pollutions of which the manager might want to at least be informed.

Some embodiments present many major advantages compared to state-of-the-art solutions.

First of all, it takes into account time and thus makes it possible to deal with the dynamic aspects of a network's load. Thus, a consumer can plug in and unplug equipment, and the solution would be capable of determining its harmonic pollution in real time, without needing, of course, to recalculate a model of its network.

Moreover, the use of quaternion notation makes it possible to distance itself from the influence of disturbances from other consumers connected to a distribution network. Indeed, as we saw above, a consumer's harmonic pollutions are transmitted via the distribution network to other consumers that are connected to it. It is therefore important to be able to isolate the pollution produced locally, at the point measuring the pollution coming from another consumer through the distribution network.

The non-linear nature of the load is determined by the values of impedances (basic frequency and harmonic frequency), which vary regardless of any non-sinusoidal current. The characterization of a non-linear nature, thus a polluting one, of the given load makes it possible to evaluate the pollution on an electrical network where all the consumers create an inter-connected and coupled system.

Each consumer is both the source of pollution and the victim of pollution created by other users. The model proposed makes it possible to consider the polluting part of one consumer alone.

It may be possible to feed an anti-harmonic-pollution filter with these values so that the filter can be configured and adapted to the actual harmonic pollution. Some embodiments also allow the filters to have real metrics, corresponding to the distribution network, rather than more theoretical models as in current state-of-the-art.

According to one method of operation in accordance with some embodiments, this procedure can be implemented continuously or periodically, in order to have an estimation of the dynamic harmonic pollution, even in real time. The configuration of the anti-harmonic filters can thus become dynamic. These filters can adapt in real time to the changes in the electrical network loads of a consumer. This is obviously a substantial advantage compared to other state-of-the-art solutions.

Of course, some embodiments are not limited to the examples and method of operation described and represented; it is likely to have many variants accessible to a person of ordinary skill in the art.

The invention claimed is:

1. A method for detecting a harmonic pollution within an electricity distribution network transmitting an electrical current, the method performed by a device, and the method comprising:

receiving a measurement of at least one voltage and at least one magnitude of the current, for each of at least one phase, at a metering point of the network;

calculating a first impedance corresponding to the basic frequency of the current; and calculating at least a second impedance corresponding to a harmonic frequency of the current, and the first impedance and the at least second impedance being calculated by transforming the voltages and magnitudes in a two-dimensional transform, defined according to an angle based on the frequency in order to provide a system of 2 vectors of 3 quantities, $u_d$, $u_q$, uo and $i_d$, $i_q$, $i_o$, respectively, and then, by applying, to determine the first impedance and the at least second impedance, the expressions:

$$Z_r = \frac{u_d \times i_d + u_q \times i_q}{i_d \times i_d + i_q \times i_q},$$

to determine a real part for the first impedance and the at least second impedance, respectively, and $$Z_i = \frac{u_q \times i_d + u_d \times i_q}{i_d \times i_d + i_q \times i_q},$$

to determine an imaginary part for the first impedance and the at least second impedance, respectively;

determining a difference between the first impedance and the at least second impedance; and determining a harmonic pollution, within the electricity distribution network, based on the difference between the first impedance and the at least second impedance.

2. The method according to claim 1, wherein the current is three-phased; the measurement includes measuring voltages and magnitudes for the three phases;

and the two-dimensional transform includes the first two dimensions of a Park transform.

3. The method according to claim 2, wherein the harmonic frequency is the harmonic frequency of order 5.

4. The method according to claim 2, wherein the at least second impedance corresponds to the harmonic frequencies of the order among the orders 5, 7, 11, 13, 17, 19, 23.

5. The method according to claim 1, wherein the current is monophasic and the two-dimensional transform is defined by the equations:

$$\begin{cases} u_d = V \times \sin(\theta) \\ u_q = V \times \cos(\theta) \end{cases}$$
$$\begin{cases} i_d = I \times \sin(\theta) \\ i_q = I \times \cos(\theta) \end{cases}.$$

6. The method according to claim 5, wherein the harmonic frequency is the harmonic frequency of order 5.

7. The method according to claim 5, wherein the at least second impedance corresponds to the harmonic frequencies of the order among the orders 5, 7, 11, 13, 17, 19, 23.

8. The method according to claim 1, wherein the harmonic frequency is the harmonic frequency of order 5.

9. The method according to claim 1, wherein the at least second impedance corresponds to the harmonic frequencies of the order among the orders 5, 7, 11, 13, 17, 19, 23.

10. The method according to claim 1, wherein the determining a harmonic pollution, within the electricity distribution network, based on the difference between the first impedance and the at least second impedance includes:
comparing the difference between the first impedance and the at least second impedance with a threshold in order to provide an indication of harmonic pollution.

11. A meter configured for detection of a harmonic pollution within an electricity distribution network transmitting a three-phase current, the meter comprising:
a voltage meter for measuring voltages and magnitudes of the current for each of the phases, of the three-phase current, at a metering point of the network;
a first device configured to calculate a first impedance corresponding to the basic frequency of the current;
a second device configured to calculate at least a second impedance corresponding to a harmonic frequency of the current,
the first impedance and the at least second impedance being calculated by transforming the voltages and magnitudes in a two-dimensional transform, defined according to an angle based on the frequency in order to provide a system of 2 vectors of 3 quantities, $u_d$, $u_q$, $u_o$ and $i_d$, $i_q$, $i_o$, respectively, and
then, by applying, to determine the first impedance and the at least second impedance, the expressions:

$$Z_r = \frac{u_d \times i_d + u_q \times i_q}{i_d \times i_d + i_q \times i_q},$$

to determine a real part for the first impedance and the at least second impedance, respectively, and $$Z_i = \frac{u_q \times i_d + u_d \times i_q}{i_d \times i_d + i_q \times i_q},$$

to determine an imaginary part for the first impedance and the at least second impedance, respectively; and wherein the meter is configured to determine a difference between the first impedance and the at least second impedance; and
the meter is configured to detect harmonic pollution based on the difference between the first impedance and the at least second impedance.

12. The meter according to claim 11, wherein the current is three-phased, the measurement step includes measuring the voltages and magnitudes for the three phases, and the two-dimensional transform is comprised of the two first dimensions of a Park transform.

13. The meter according to claim 12, wherein the harmonic frequency is the harmonic frequency of order 5.

14. The meter according to claim 12, wherein the at least second impedance corresponds to the harmonic frequencies of an order among the orders 5, 7, 11, 13, 17, 19, 23.

15. The meter according to claim 11, wherein the current is monophasic and the two-dimensional transform is defined by the equations:

$$\begin{cases} u_d = V \times \sin(\theta) \\ u_q = V \times \cos(\theta) \end{cases}$$
$$\begin{cases} i_d = I \times \sin(\theta) \\ i_q = I \times \cos(\theta) \end{cases}.$$

16. The meter according to claim 15, wherein the harmonic frequency is the harmonic frequency of order 5.

17. The meter according to claim 11, wherein the harmonic frequency is the harmonic frequency of order 5.

18. The meter according to claim 11, wherein the at least second impedance corresponds to the harmonic frequencies of an order among the orders 5, 7, 11, 13, 17, 19, 23.

19. An electricity distribution network, comprising:
a plurality of meter according to claim 11.

20. The electricity distribution network according to claim 19, further comprising a plurality of distribution branches between an input terminal and consumers; and a meter, of the plurality of meters, associated to each of the consumers, in order to determine the consumer(s) at the source of a harmonic pollution.

21. A system, comprising:
the meter according to claim 11; and
an anti-harmonic filter, wherein the harmonic pollution determined by the meter provides for dynamically configuring the filter.

* * * * *